(12) United States Patent
Liu et al.

(10) Patent No.: US 9,060,144 B2
(45) Date of Patent: Jun. 16, 2015

(54) IMAGE SENSOR AND MANUFACTURING METHOD THEREOF

(71) Applicant: TAIWAN SEMICONDUCTOR MANUFACTURING COMPANY LTD., Hsinchu (TW)

(72) Inventors: Yi-Sheng Liu, Yilan County (TW); Yun-Wei Cheng, Taipei (TW); Volume Chien, Tainan County (TW); Chi-Cherng Jeng, Tainan County (TW); Hsin-Chi Chen, Tainan (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 13/968,764

(22) Filed: Aug. 16, 2013

(65) Prior Publication Data
US 2015/0049229 A1 Feb. 19, 2015

(51) Int. Cl.
*H04N 3/14* (2006.01)
*H04N 5/335* (2011.01)
*H04N 5/374* (2011.01)
*H01L 31/18* (2006.01)
*H01L 27/146* (2006.01)

(52) U.S. Cl.
CPC ............... *H04N 5/374* (2013.01); *H01L 31/18* (2013.01); *H01L 27/14685* (2013.01)

(58) Field of Classification Search
USPC ........ 348/294–324; 250/208.1; 257/290–292; 438/72
See application file for complete search history.

(56) References Cited

U.S. PATENT DOCUMENTS

| | | | |
|---|---|---|---|
| 7,824,998 B2 * | 11/2010 | Liu et al. | 438/397 |
| 2006/0138577 A1 * | 6/2006 | Hashimoto | 257/432 |
| 2009/0200625 A1 * | 8/2009 | Venezia et al. | 257/432 |
| 2013/0200251 A1 * | 8/2013 | Velichko | 250/208.1 |

* cited by examiner

*Primary Examiner* — Yogesh Aggarwal
(74) *Attorney, Agent, or Firm* — WPAT, P.C.; Anthony King

(57) ABSTRACT

An image sensor comprises an image sensing substrate that in turns includes an image sensing device, a first sensor pixel, a second sensor pixel, and a divider. The divider is between the first sensor pixel and the second sensor pixel.

10 Claims, 20 Drawing Sheets

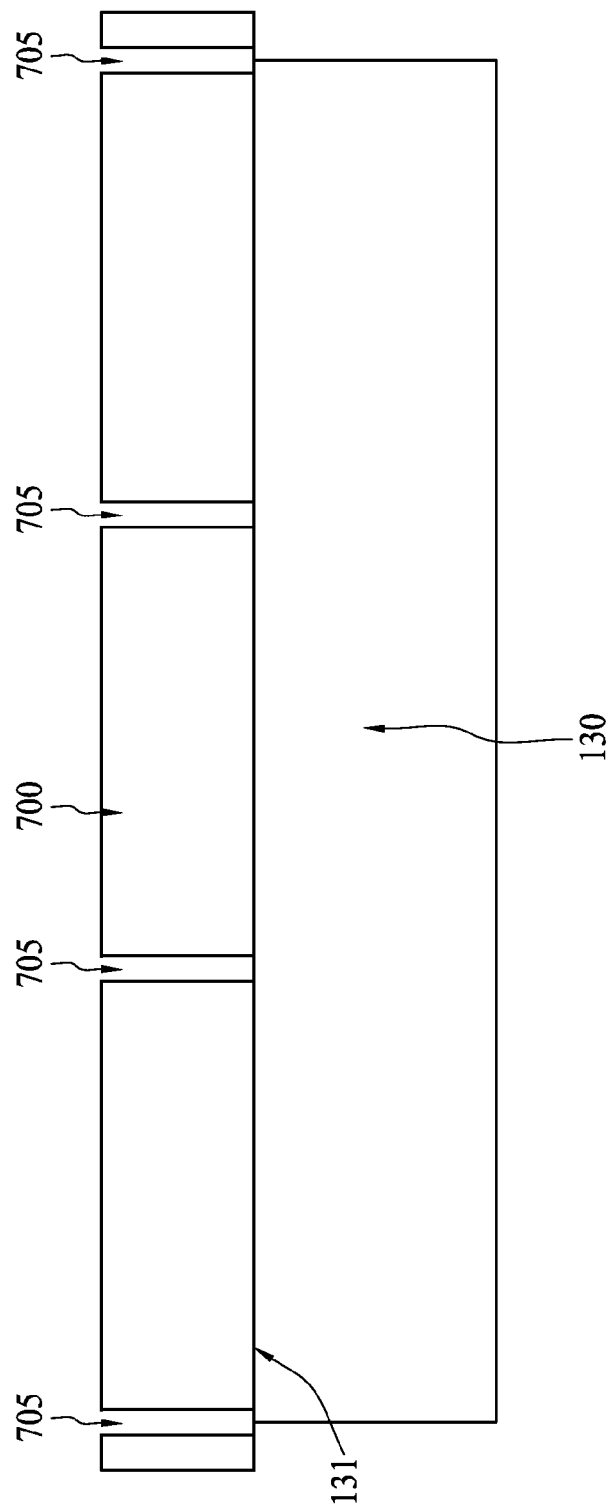

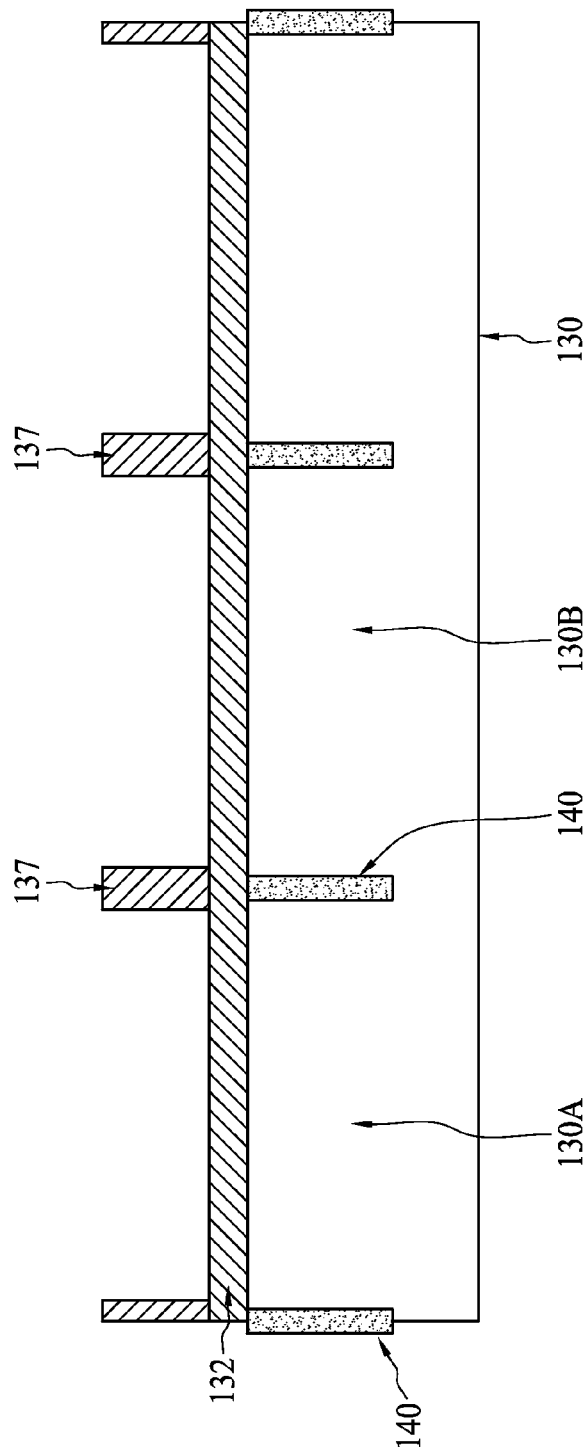

IMAGE SENSOR AND MANUFACTURING METHOD THEREOF

FIELD

The present disclosure relates to a semiconductor image sensor.

BACKGROUND

Semiconductor image sensors are used to sense radiation such as lights. Complementary metal-oxide-semiconductor (CMOS) image sensors (CIS) are widely used in various applications such as digital camera or mobile phone camera. These devices utilize an array of pixels located in a substrate, including photodiodes and transistors that can absorb radiation projected toward the substrate, and convert the sensed radiation into electrical signals.

A back side illuminated (BSI) image sensor device is one type of image sensor device. These BSI image sensor devices detect lights projected from the backside of the image sensor devices. A BSI image sensor device has a relatively thin silicon substrate (e.g., a few microns thick) in which light-sensing pixels are formed. The quantum efficiency and the well capacity of the BSI image sensors depend on the size of the radiation-sensing region. Interference between light-sensing pixels becomes problematic when the pixel density increases. Some BSI CIS products use grids to avoid crosstalk between pixels, but still cannot eliminate the crosstalk.

BRIEF DESCRIPTION OF THE DRAWINGS

Aspects of the present disclosure are described with reference to the accompanying figures. It is emphasized that, in accordance with the standard practice in the industry, various features are not drawn to scale. In fact, the dimensions of the various features may be arbitrarily increased or reduced for clarity of discussion.

FIGS. 7A-7D illustrate forming a trench in an image sensor in FIG. 1 in accordance with some embodiments of the present disclosure.

FIGS. 11A-11F illustrate forming an image sensor in FIG. 1 in accordance with some embodiments of the present disclosure.

DETAILED DESCRIPTION OF THE INVENTION

The making and using of various embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

An image sensor is a device used to capture photons, and generate electrical signals from the received photons. In some embodiments, the image sensor includes a pixel array having a number of sensor pixels. Each sensor pixel is designed to receive an incident light with a predetermined wavelength spectrum. In some embodiments, a divider is in a sensing region of a sensor pixel. The divider is disposed on an interface between a sensor pixel and an adjacent sensor pixel to reduce and/or eliminate interference from the adjacent sensor pixel. The divider acts to separate at least a portion of the sensing region of adjacent sensor pixels. With the divider, filtered incident lights in a sensing region of a sensor pixel are restricted to travel in the sensing region without interfering a sensing region of an adjacent sensor pixel.

Figure 1:
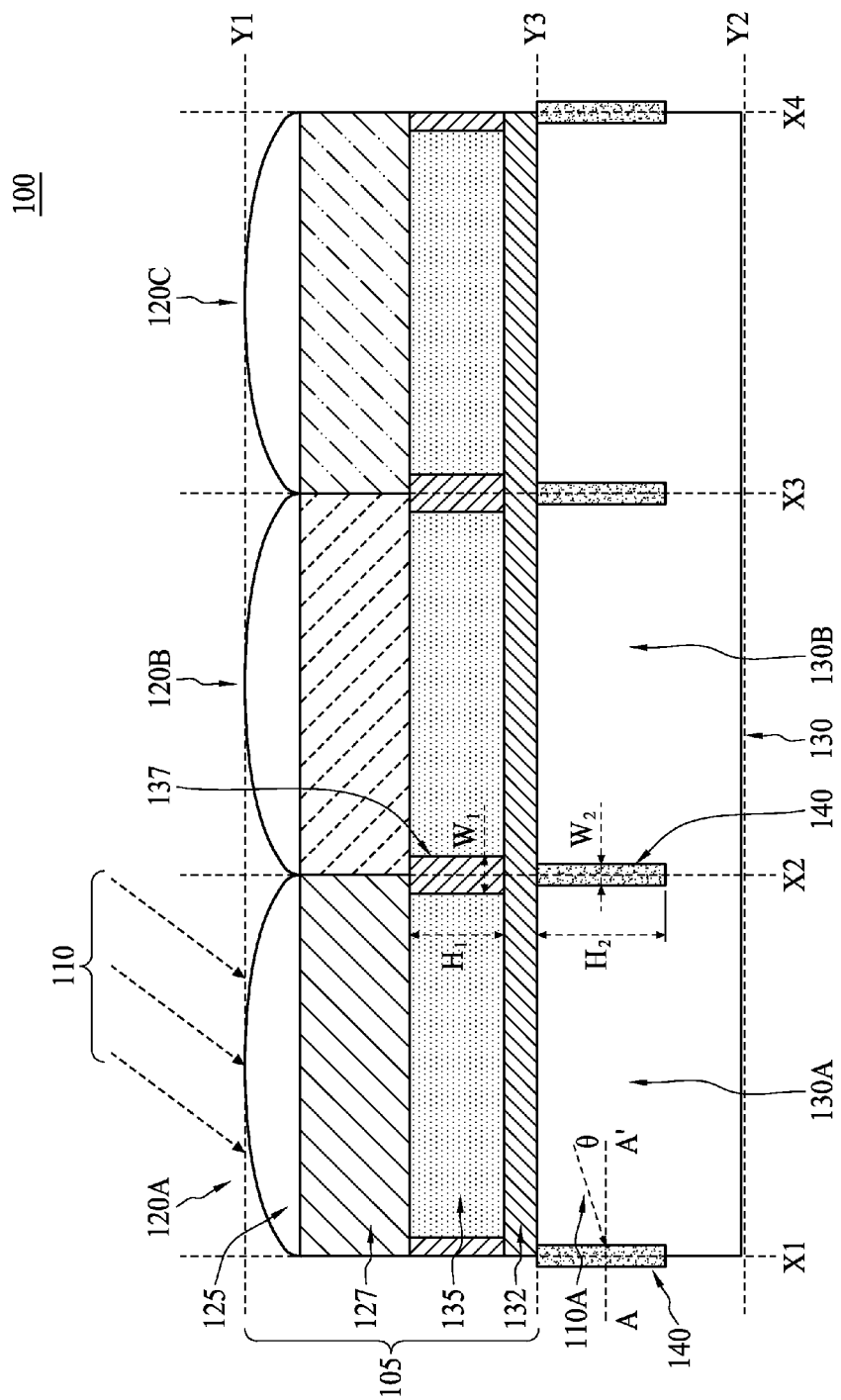
FIG. 1 is a cross section view of an image sensor, in accordance with some embodiments of the present disclosure.

FIG. 1 is a cross sectional view of an image sensor 100, in accordance with some embodiments. The image sensor 100 is configured to capture photons. In some embodiments, the image sensor 100 contains a complementary metal oxide semiconductor (CMOS) structure. Captured photons are converted by the CMOS structure to generate an electrical signal. Dotted arrow lines 110 are used to illustrate incident lights received by the image sensor 100.

The image sensor 100 has sensor pixels and each is designated to receive lights with a predetermined wavelength spectrum. For some embodiments with reference to FIG. 1, the image sensor 100 has a sensor pixel 120A, a sensor pixel 120B and a sensor pixel 120C. The sensor pixel 120A has a height from line $Y_1$ to line $Y_2$, and a width from line $X_1$ to line $X_2$. Line $X_2$ is a boundary between the sensor pixel 120A and the sensor pixel 120B. The sensor pixel 120B has a height from line $Y_1$ to line $Y_2$, and a width from line $X_2$ to line $X_3$. The sensor pixel 120C has a height from line $Y_1$ to line $Y_2$, and a width from line $X_3$ to line $X_4$. The sensor pixel 120A is designated to receive incident lights and operate with a first wavelength spectrum. The sensor pixel 120B is designated to receive incident lights and operate with a second wavelength spectrum. The sensor pixel 120C is designated to receive incident lights and operate with a third wavelength spectrum. In some embodiments, the first wavelength spectrum is red, the second first wavelength spectrum is green, and the third wavelength spectrum is blue. Other wavelength spectrums are within the contemplated scope of the present disclosure. In some embodiments with reference to FIG. 1, no gap or spacing exists between adjacent sensor pixels 120A and 120B, and 120B and 120C, in order to have a maximum pixel density to achieve an optimized resolution.

Each sensor pixel 120A, 120B or 120C has a similar structure. The following description is based on sensor pixel 120A, but is applicable to other pixels, including pixels 120B and 120C. As illustratively shown in FIG. 1, the sensor pixel 120A has an optical region 105, which is between line $Y_1$ to line $Y_3$ and a sensing region 130A, which is between line $Y_2$ to line $Y_3$. The optical region 105 is exposed under a light source. The sensing region 130A is disposed under the optical region 105. The sensing region receives filtered incident lights and converts the photons of filtered incident lights into an electrical signal. For some embodiments, the sensing region 130A converts red photons into electrical signals.

A lens 125 is in the optical region 105. The top point of the lens 125 is substantially at a same level of line $Y_1$. The lens 125 is designed as a window for incident lights traveling into the sensor pixel 120A. In some embodiments, the lens 125 is a convex lens and the incident lights are focused by the lens 125.

A color filter 127 is disposed under the lens 125. The color filter 127 is used to filter incident lights to generate filtered lights with a desired wavelength spectrum. In some embodiments, the sensor pixel 120A is designated to detect red lights. The incident lights 110 are visible lights, which have a wide range of wavelength spectrum. The color filter 127 is designed to allow lights having a red wavelength spectrum to enter into the sensing region 130A of the sensor pixel 120A. In other words, the color filter 127 is a red light filter. Similarly, if the sensor pixel 120A is designated to detect green light, the color filter 127 is a green light filter, and if the sensor pixel 120A is designated to detect blue light, the color filter 127 is a blue light filter, etc.

In the optical region 105, a dielectric layer 135 is disposed under the color filter 127. In some embodiments, the dielectric layer 135 is made with silicon oxide, silicon nitride, or other suitable materials. The dielectric layer 135 separates the color filter 127 from the sensing region 130A. Filtered lights travel into the dielectric layer 135 before entering into the sensing region 130A. In order to avoid filtered lights entering into the adjacent sensor pixel 120B, a light guiding grid 137 is disposed along a sidewall of the dielectric layer 135 of the sensor pixels 120A and 120B. The light guiding grid 137 separates the dielectric layer 135 of the sensor pixel 120A from the dielectric layer 135 of the adjacent sensor pixel 120B. The light guiding grid 137 is made with light reflective material such as a metal or dielectric or other suitable materials. In some embodiments, the light guiding grid 137 includes AlCu, W, SiO2 or SiN. The light guiding grid 137 reflects filtered lights when the filtered lights hit the light guiding grid 137. The light guiding grid 137 has a width $W_1$ and a height $H_1$.

In some embodiments, the sensor pixel 120A has an anti reflection coating (ARC) 132 under the dielectric layer 135. The ARC 132 has a refractive index, which is smaller than a refractive index of the sensing region 130A. Thus the filtered incident lights are not reflected by the ARC 132.

A semiconductor substrate 130 is a region defined between line $Y_2$ and line $Y_3$, and between line $X_1$ and line $X_4$. The sensing region 130A of the sensor pixel 120A includes a portion of the substrate 130. Such a portion is called an image sensing substrate. The image sensing substrate includes some image sensing devices such as a CMOS transistor, photodiodes, a transfer transistor, and other image sensing circuits. When the filtered lights enter into the sensing region 130A, the CMOS transistor converts captured photons into electrical signals.

In some embodiments illustrated in FIG. 1, dividers 140 are disposed in the substrate 130. For illustration, two dividers 140 are labeled. One of the dividers 140 separates at least a portion of the sensing region 130A from the sensing region 130B of the adjacent sensor pixel 120B. The divider 140 prevents the filtered incident lights in the sensor pixel 120A from entering into the sensing region 130B of adjacent sensor pixel 120B; and vice versa. In some other embodiments, the sensor pixel 120A is designated to detect red lights, and the adjacent sensor pixel 120B is designated to detect green lights. With reference to the sensor pixel 120A, a certain amount of red light photons generates electrical signals that indicate the receiving lights are red lights. Further, a certain amount of green photons from the adjacent sensor pixel 120B crossing the boundary line $X_2$ is acceptably received by the sensor pixel 120A.

Effectively, the divider 140 prevents the sensor pixel 120A from generating unwanted electrical signals caused by the green lights from the adjacent sensor pixel 120B. Similarly, the divider 140 prevents the sensor pixel 120B from generating unwanted electrical signals caused by the red lights from the adjacent sensor pixel 120A.

The divider 140 is designed to retain filtered incident lights in the sensing region 130A. In some embodiments, the filtered incident lights that reach the divider 140 are reflected by the divider 140. A dotted line 110A represents the filtered incident lights in the sensor pixel 120A. Line AA' is used to identify an angle $\theta$. The angle $\theta$ is an incident angle of the filtered incident lights 110A. The divider 140 has a refractive index $n_1$ and the substrate 130 has a refractive index $n_2$. In some embodiments, $n_1$ is smaller than $n_2$. Thus, a filtered incident light with an incident angle $\theta$ greater than $\arcsin(n_1/n_2)$ is totally reflected by the divider 140. In some embodiments, $n_1$ is one half of $n_2$, a filtered incident light with incident angle $\theta$ greater than 30 degrees is totally reflected by the divider 140. In some embodiments, the divider 140 includes silicon dioxide, which has a refractive index $n_1$ of 1.52. The substrate 130 is silicon and has a refractive index $n_2$ of 3.42. For any filter incident light having an incident angle $\theta$ greater than about 26 degrees is totally reflected by the divider 140. In some embodiments, the divider 140 includes silicon nitride, which has a refractive index $n_1$ of 2.02. The substrate 130 is silicon. For any filtered incident light having an incident angle $\theta$ greater than about 36 degrees is totally reflected by the divider 140. In some embodiments, the divider 140 includes silicon oxynitride (SION), which has a refractive index $n_1$ of 1.05. The substrate 130 is silicon. For any filtered incident light having an incident angle $\theta$ greater than about 17.5 degrees is totally reflected by the divider 140. The totally reflected filtered incident lights are retained in the sensor pixel 120A and do not cause interference to the adjacent sensor pixel 120B. Different refraction index, materials of the substrate 130 and/or incident angles are within the scope of the present disclosure.

The divider 140 has a height $H_2$. In some embodiments, $H_2$ is greater than a certain value in order to retain the filtered incident lights in the sensor pixel 120A. The greater $H_2$ is, the more filtered incident lights are retained in the sensing region 130A. Thus, less interference is from the adjacent sensor pixel 120B. In some embodiments, $H_2$ is greater than a half of a height $H_1$ of the light guiding grid 137, i.e., $H_2 > 0.5 H_1$.

Because the crystalline structures of the divider 140 and of the substrate 130 are different, a lattice mismatch exists between the divider 140 and the substrate 130. In some embodiments, the lattice mismatch causes damages in the substrate 130. In some embodiments, $H_2$ is designed to be smaller than a certain value to avoid causing damages in the substrate 130. In some embodiments, $H_2$ is less than two times of $H_1$, i.e. $H_2 < 2 H_1$.

The divider 140 has a width $W_2$. In some embodiments, $W_2$ is greater than a certain value in order to retain the filtered incident lights in the sensor pixel 120A. The greater $W_2$ is, the more filtered incident lights are retained in the sensing region 130A. Thus, less interference is from the adjacent sensor pixel 120B. In some embodiments, $W_2$ is greater than a half of a width $W_1$ of the light guiding grid 137, i.e. $W_2 > 0.5 W_1$.

If $W_2$ is wider than a certain value, some filtered incident lights are blocked at an interface between the divider 140 and the ARC 132. In some embodiments, $W_2$ is less than about two times of $W_1$, i.e. $W_2<2 W_1$.

In some embodiments, the divider 140 is electrically is isolative, and includes silicon oxide, silicon nitride, silicon oxynitride. Other materials are within the scope of the present disclosure.

Figure 2:
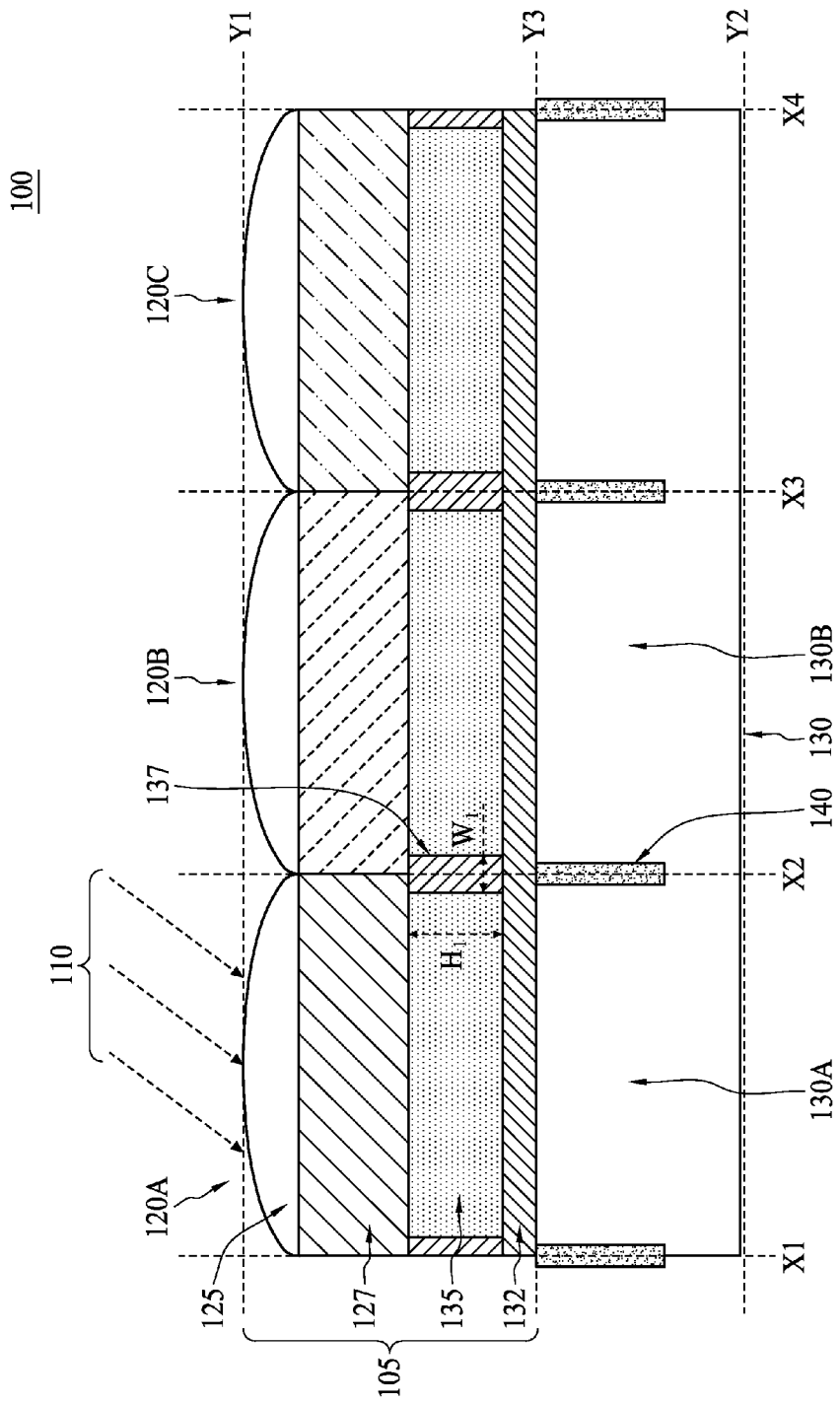
FIG. 2 is a cross section view of an image sensor of FIG. 1 having an asymmetrical divider, in accordance with some embodiments of the present disclosure.

The divider 140 is located under and aligns with the light guiding grid 137. In some embodiments in FIG. 1, the divider 140 is symmetrical with reference to the line $X_2$. In some embodiments, the divider 140 is symmetrical with reference to the line $X_2$ and the light guiding grid 137 is also symmetrical with reference to the line $X_2$. Thus, the divider 140 aligns with the light guiding grid 137. In some embodiments with reference to FIG. 2, the divider 140 is not symmetrical with reference to the line $X_2$. For example, the divider 140 between the sensing region 130A and the sensing 130B is located such that a portion on the left side of the line $X_2$ is larger than a portion on the right side of the line $X_2$. In some other embodiments, the divider 140 between the sensing region 130A and the sensing 130B is located such that a portion on the right side of the line $X_2$ is larger than a portion on the left side of the line $X_2$.

Figure 3:
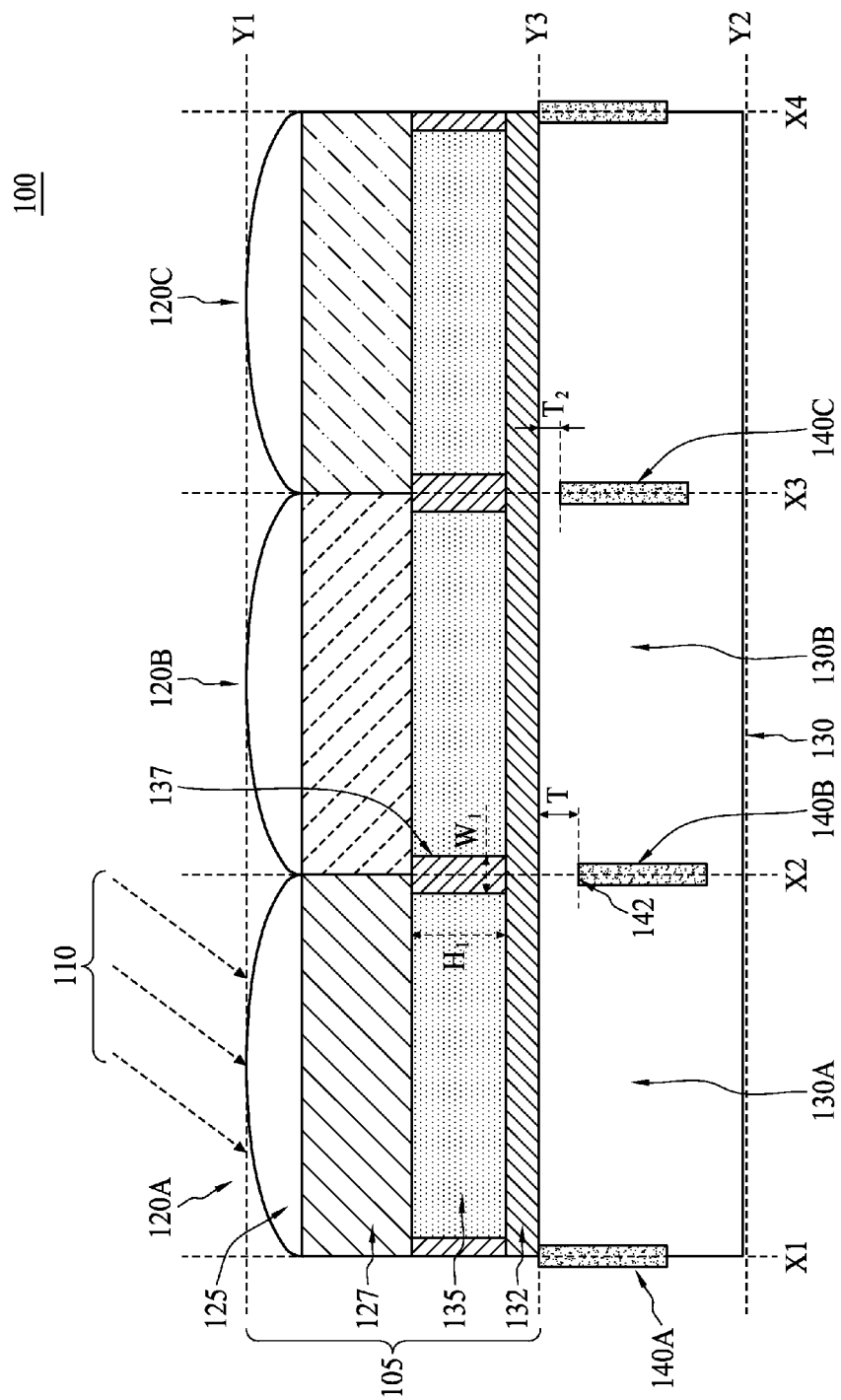
FIG. 3 is a cross section view of an image sensor of FIG. 1 having a gap between a divider and an ARC layer, in accordance with some embodiments of the present disclosure.

In some embodiments, a divider 140B has a gap T from the ARC 132 as shown in FIG. 3. The gap T is a distance between line $Y_3$ and a top surface 142 of the divider 140B. The divider 140B corresponds to the divider 140 in FIG. 1. In some embodiments as in FIG. 3, each divider 140 has a different gap with the ARC 132. For example, the divider 140A has no gap with the ARC 132 and the divider 140C has a gap $T_2$, which is smaller than the gap T of the divider 140B. Different configurations of the dividers 140 having different gaps are within the scope of the present disclosure.

Figure 4:
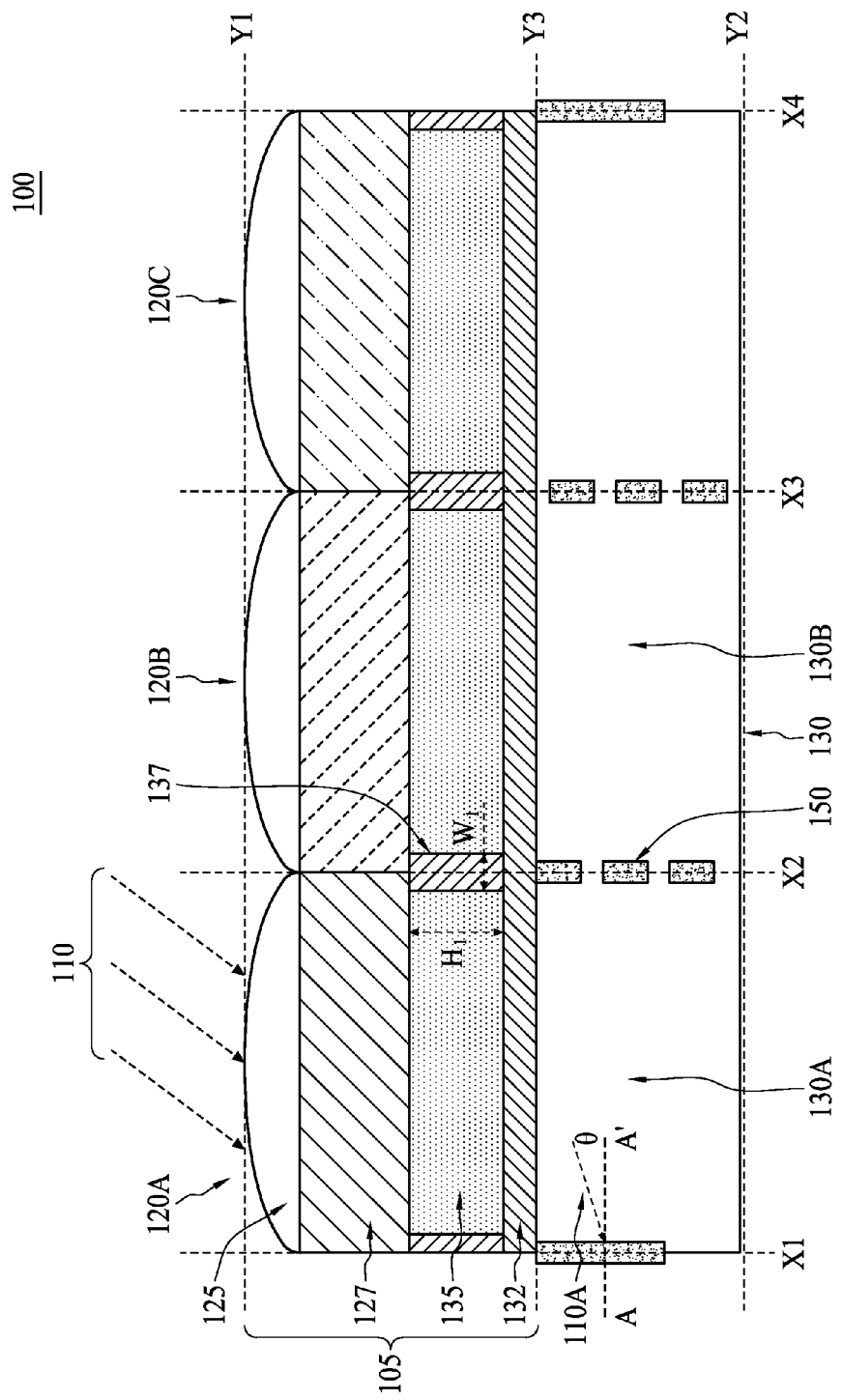
FIG. 4 is a cross section view of a divider having several sections in an image sensor of FIG. 1, in accordance with some embodiments of the present disclosure.

In some embodiments, a divider 140 includes a plurality of sections. In FIG. 4, a divider 150 corresponds to the divider 140 in FIG. 1. For illustration, the divider 150 is shown to include three sections in the substrate 130. Different number of sections and/or different sizes of each section are within the scope of the present disclosure.

Figure 5:
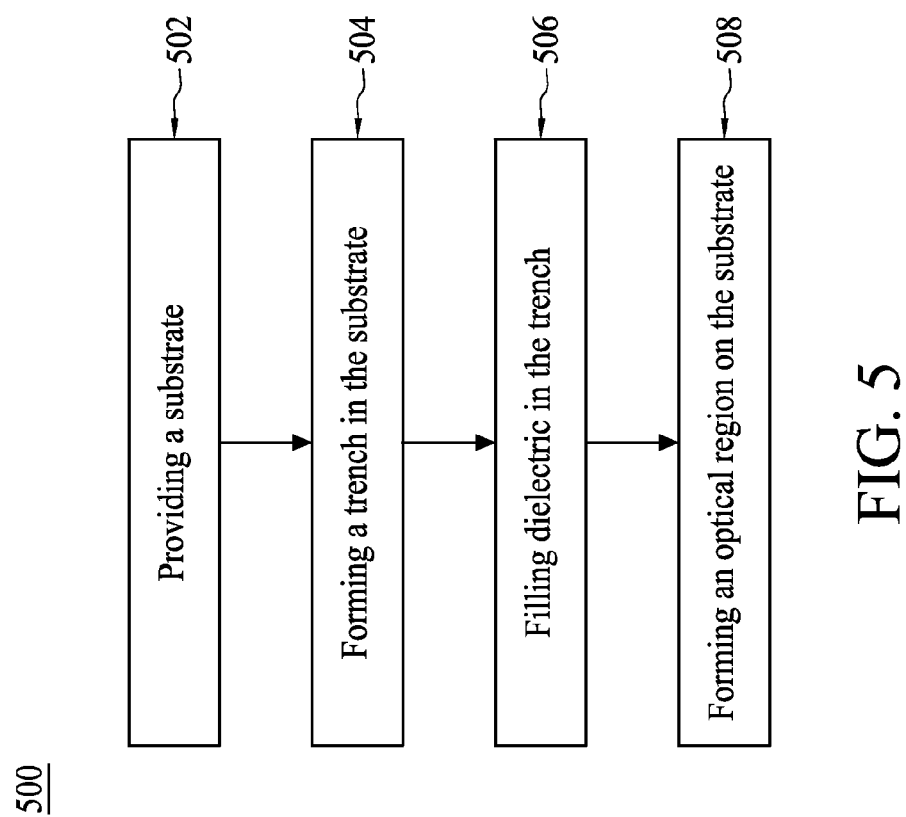
FIG. 5 is a method of manufacturing an image sensor in FIG. 1 in accordance with some embodiments of the present disclosure.

FIG. 5 is a method 500 according to some embodiments of the present disclosure. The method 500 includes operations to form the divider 140 in the image sensor 100 in FIG. 1. In operation 502, the substrate 130 in FIG. 1 is provided. In operation 504, a trench is formed in the substrate 130. The trench is formed at a location prepared for the divider 140. In operation 506, the trench is filled with a dielectric to form the divider 140. Effectively, the divider 140 is formed by the dielectric in the trench. In operation 508, the optical region 105 is formed on the substrate 130.

Figure 6:
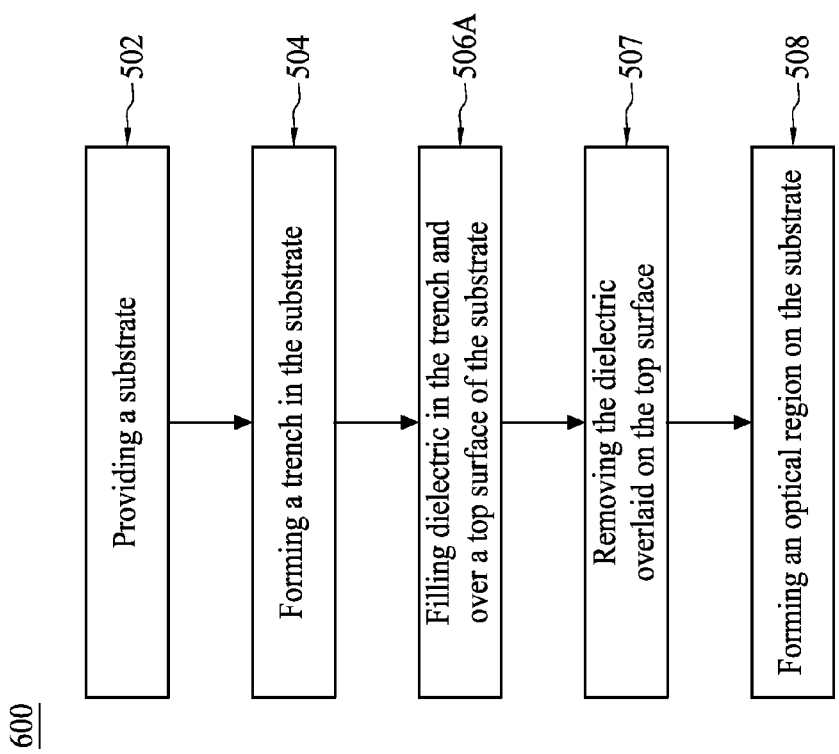
FIG. 6 is a method of manufacturing an image sensor in FIG. 1 in accordance with some embodiments of the present disclosure.

FIG. 6 is a method 600 according to some embodiments of the present disclosure. The method 600 operates in conjunction with the method 500 in FIG. 5 to form the divider 140. In addition to operations 502, 504, and 508, the method 600 includes operation 506A and operation 507. In operation 506A, the dielectric in FIG. 5 is filled in the trench and over a top surface of the substrate. In other words, the dielectric overfills the trench and forms a dielectric on the top surface of the substrate 130. In operation 507, the dielectric overlaid on the top surface of the substrate 130 is removed. The remaining portion of the dielectric in the trench results in the divider 140.

Figure 7A:
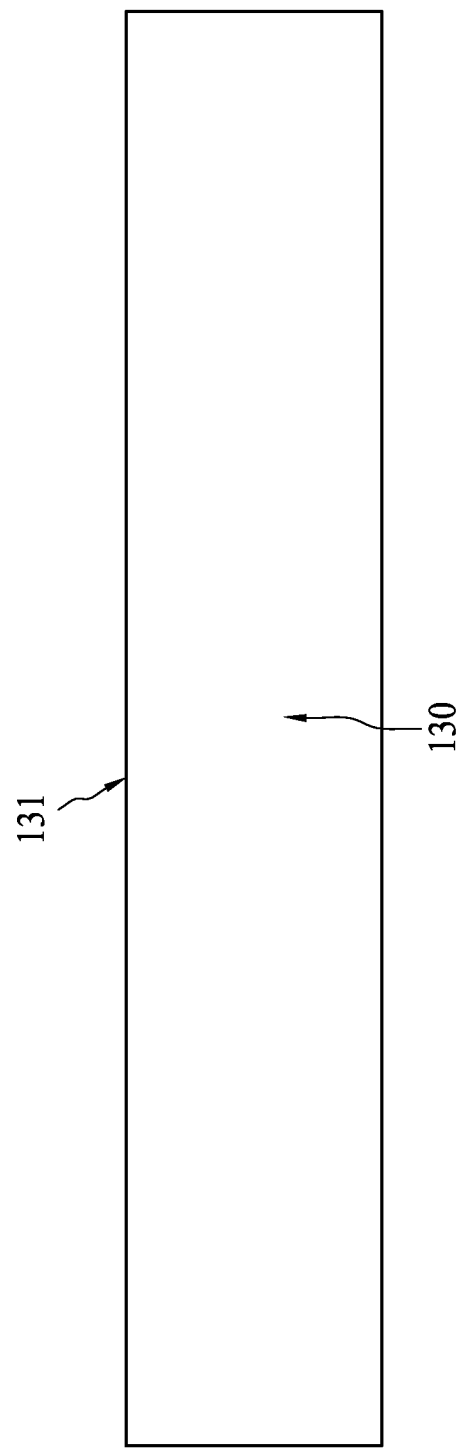
Figure 7C:
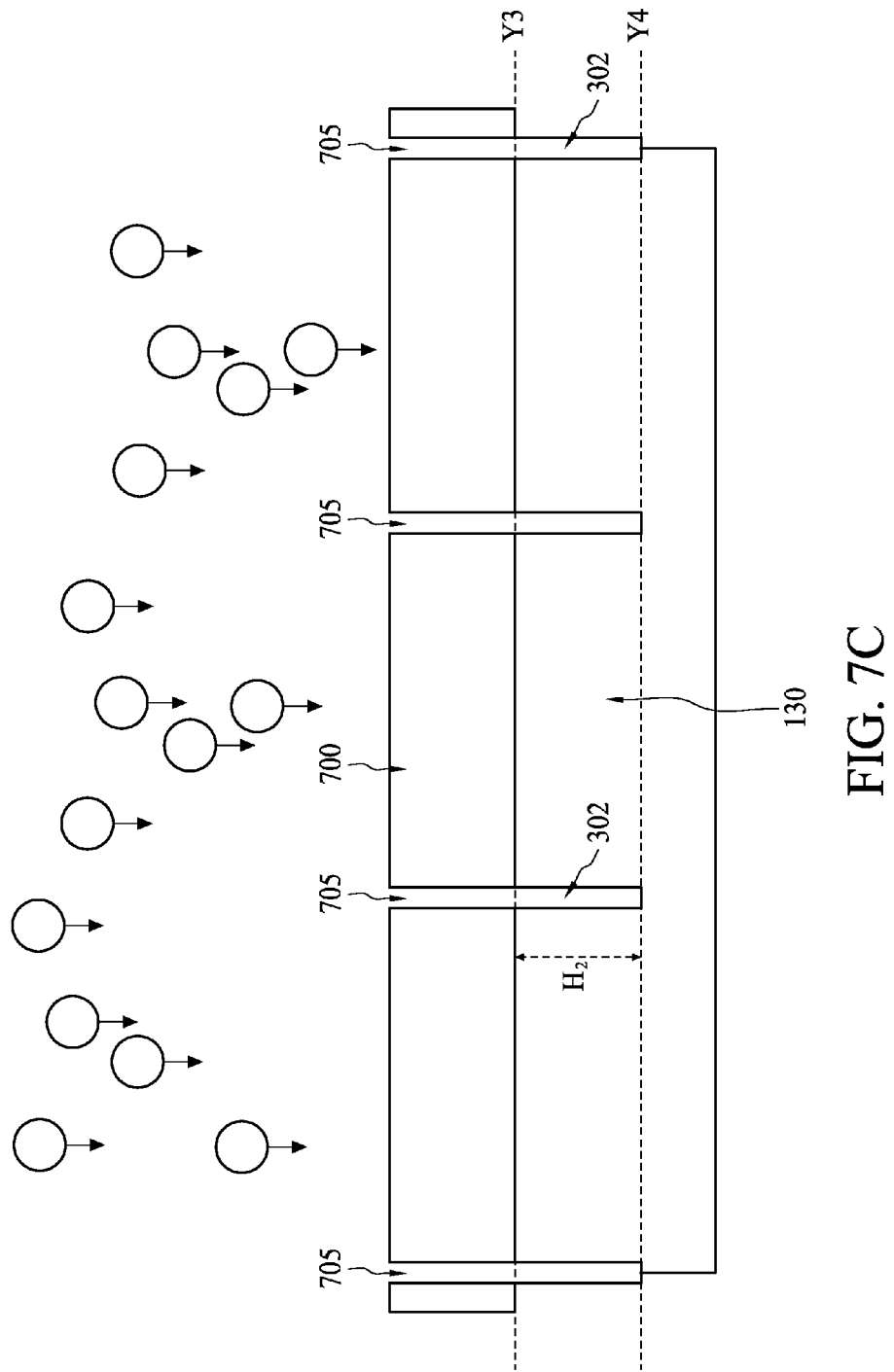
Figure 7D:
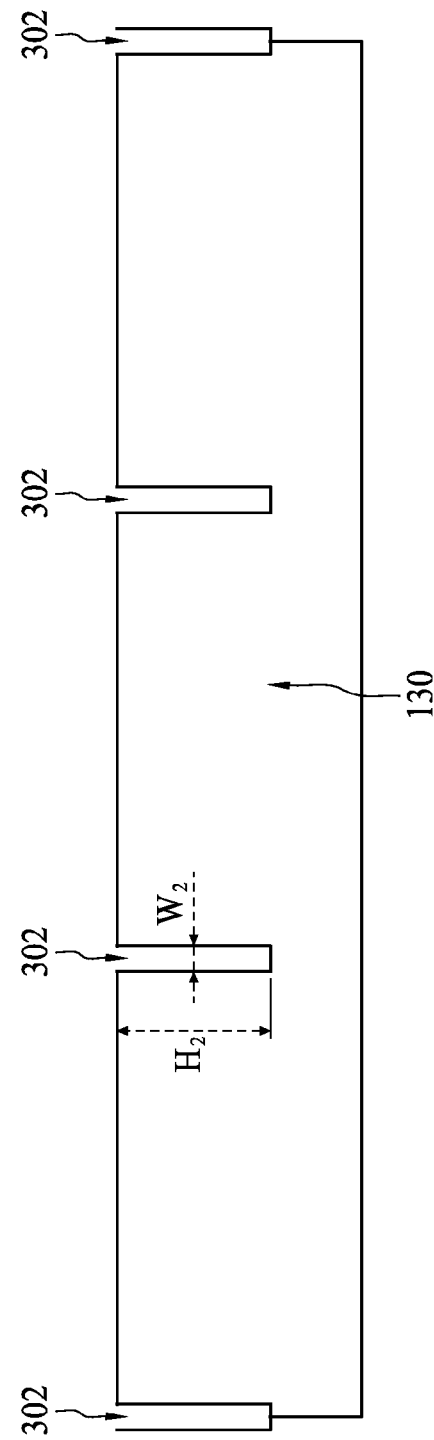

FIGS. 7A to 7C are cross sectional views illustrating an etch operation used in the operation 504 in FIGS. 5 and 6, in accordance with some embodiments. In FIG. 7A, the substrate 130 in FIG. 1 is provided. The substrate 130 has a top surface 131. In FIG. 7B, a mask layer 700 is disposed on the top surface 131. The mask 700 has holes 705, and four holes 705 are shown for illustration. In FIG. 7C, an etch operation is performed to form trenches 302 in the substrate 130. Four trenches 302 corresponding to four holes 705 are shown for illustration. In some embodiments illustrated in FIG. 7C, the etch operation is an anisotropic etch, which includes an RIE (reactive ion etch) process. A circle with an arrow represents an ion used for the anisotropic etch. In some embodiments, the trenches 302 include the same heights, but different heights are within the scope of the disclosure. The trenches 302 have a height $H_2$, which corresponds to the height of the divider 140 in FIG. 1. The height $H_2$ is a distance between line $Y_3$ and line $Y_4$. In FIG. 7D, the mask layer 700 is removed. The width $W_2$ of the trench 302 corresponds to the width of the divider 140 in FIG. 1.

Figure 8A:
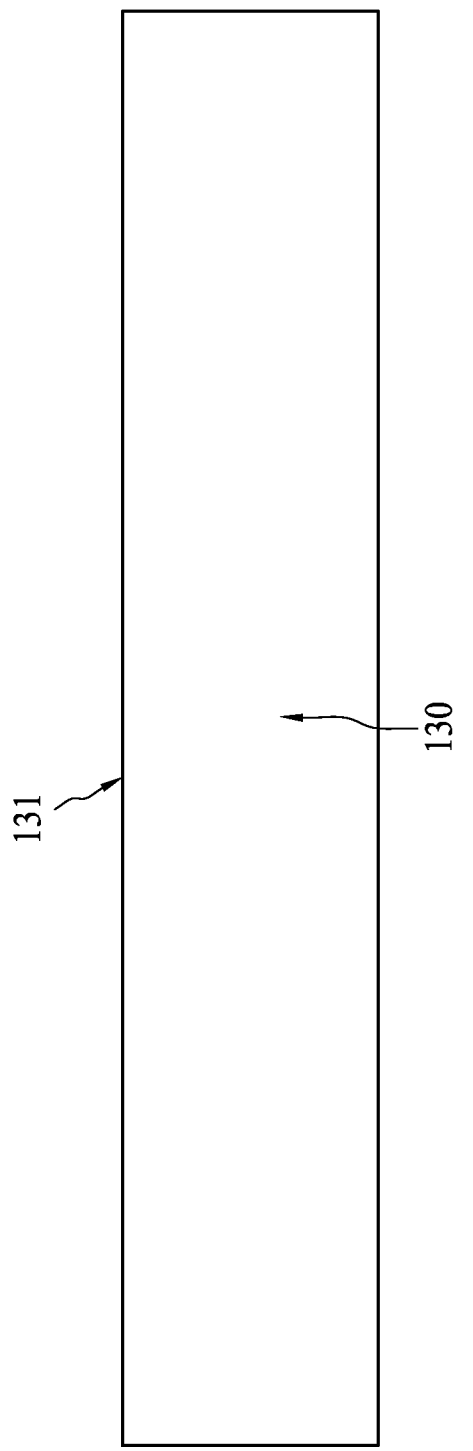
FIGS. 8A-8B illustrate forming a trench in an image sensor in FIG. 1 in accordance with some embodiments of the present disclosure.
Figure 8B:
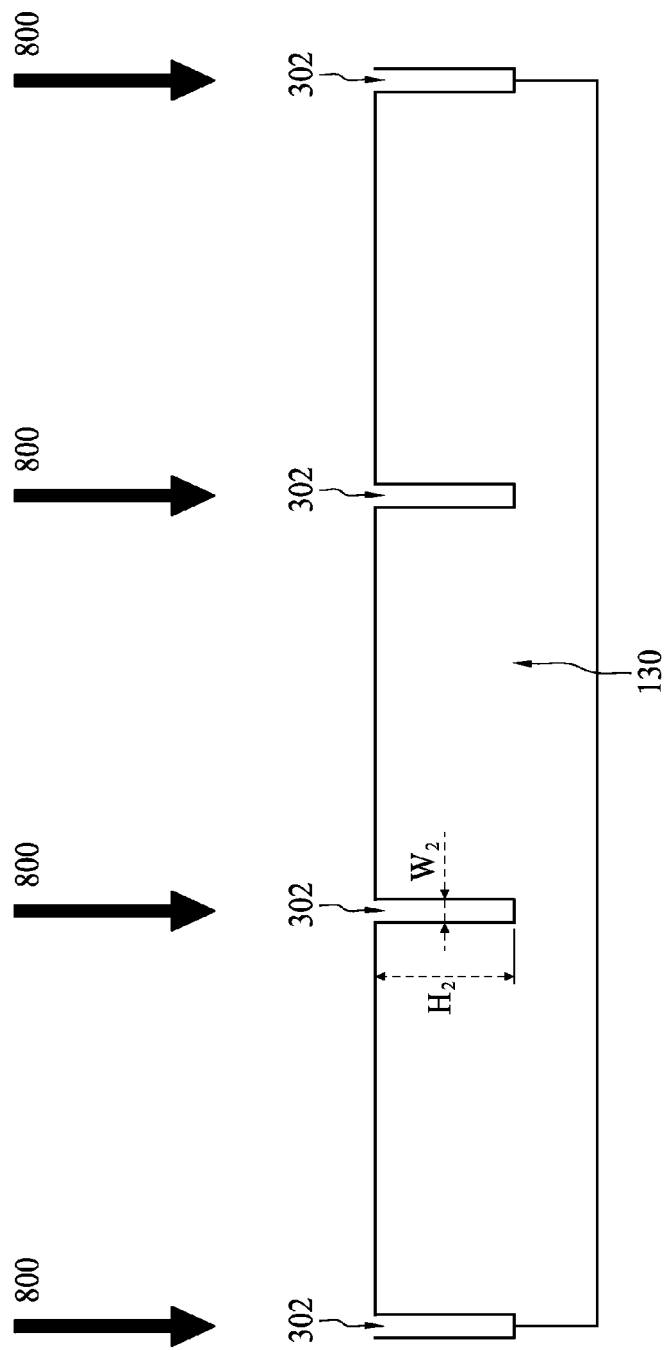

FIGS. 8A and 8B are cross sectional views illustrating a laser drilling operation used in operation 504 in FIG. 5, in accordance with some embodiments. In FIG. 8A, the substrate 130 is provided. In FIG. 8B, a laser beam 800 is used to drill the trenches 302 in the substrate 130.

Figure 9:
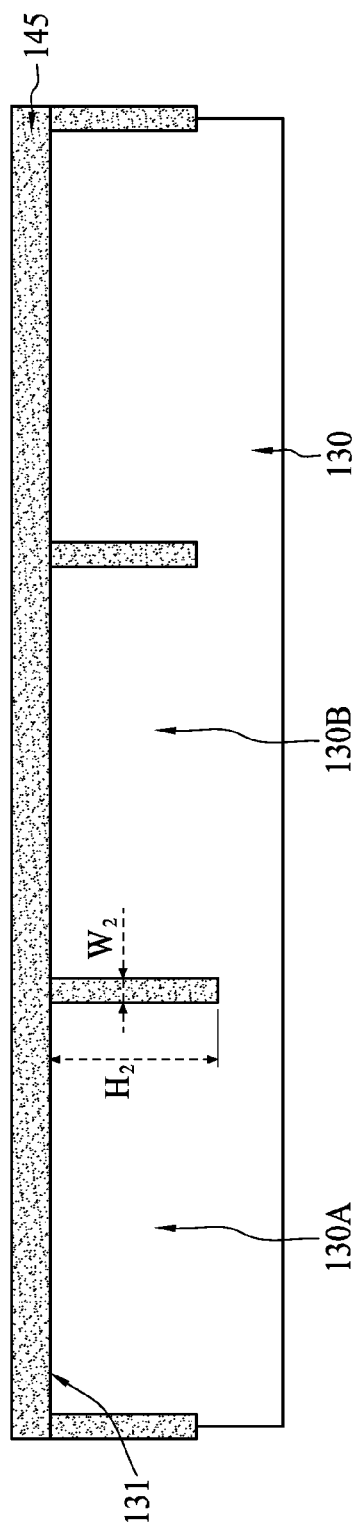
FIG. 9 illustrates forming a dielectric in an image sensor in FIG. 1 in accordance with some embodiments of the present disclosure.
Figure 10:
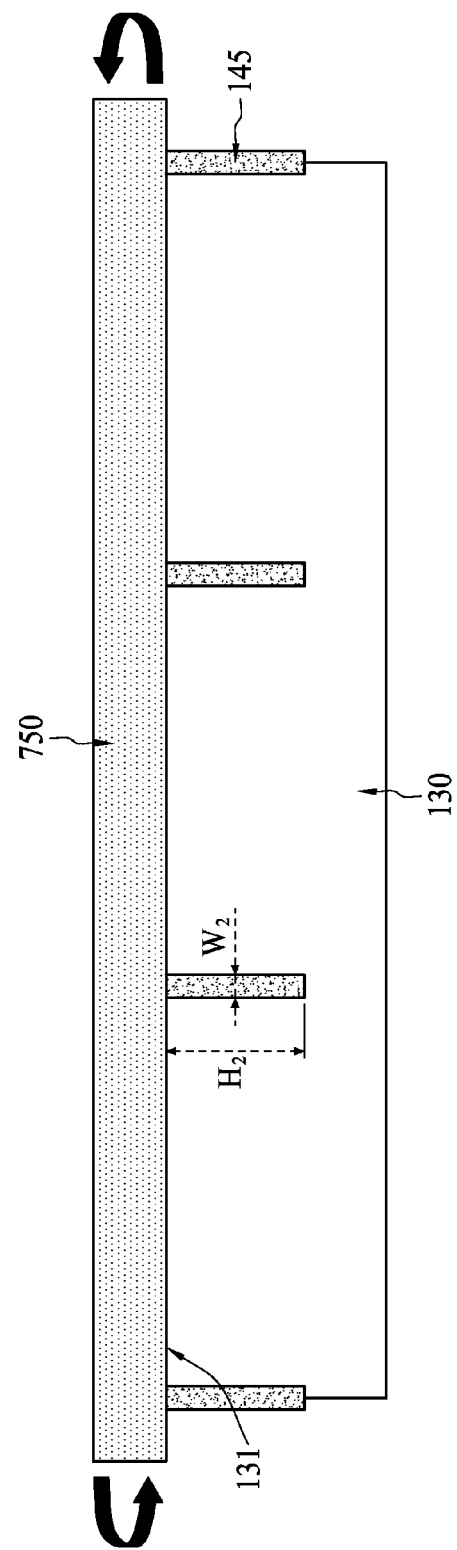
FIG. 10 illustrates removing a portion of a dielectric in an image sensor in FIG. 1 in accordance with some embodiments of the present disclosure.

FIG. 9 is a cross sectional view illustrating a CVD operation used in operation 506A in FIG. 6, in accordance with some embodiments. In FIG. 9, the trenches 302 (not labeled in this drawing) in FIG. 7C are filled with a dielectric 145. The top surface 131 is also covered by the dielectric 145. In some embodiments, the CVD operation includes a high density plasma (HDP) process. FIG. 10 is a cross sectional view illustrating a CMP operation used in operation 507 in FIG. 6, in accordance with some embodiments. A polish head 750 is used in the CMP operation to remove the dielectric overlaid on the top surface 131. The dielectric 145 formed on the top surface 131 is removed by the CMP operation. The remaining dielectric 145 corresponds to the divider 140 in FIG. 1. In some embodiments, a time mode and/or an end-point mode CMP are used to remove the dielectric on the top surface 131. The remaining dielectric 145 is located between different sensing regions, such as 130A and 130B.

In some embodiments, a time mode blanket etch is used to replace the CMP operation. The time mode blanket etch includes an operation to etch away the dielectric on the top surface 131. A time of the etching away operation is determined by a thickness of the dielectric overlaid on the top surface 131.

In some embodiments, an etch operation used in operation 507 in FIG. 6 includes an isotropic of an anisotropic etch. The dielectric material overlaid the top surface 131 is removed by the etch operation.

Figure 11A:
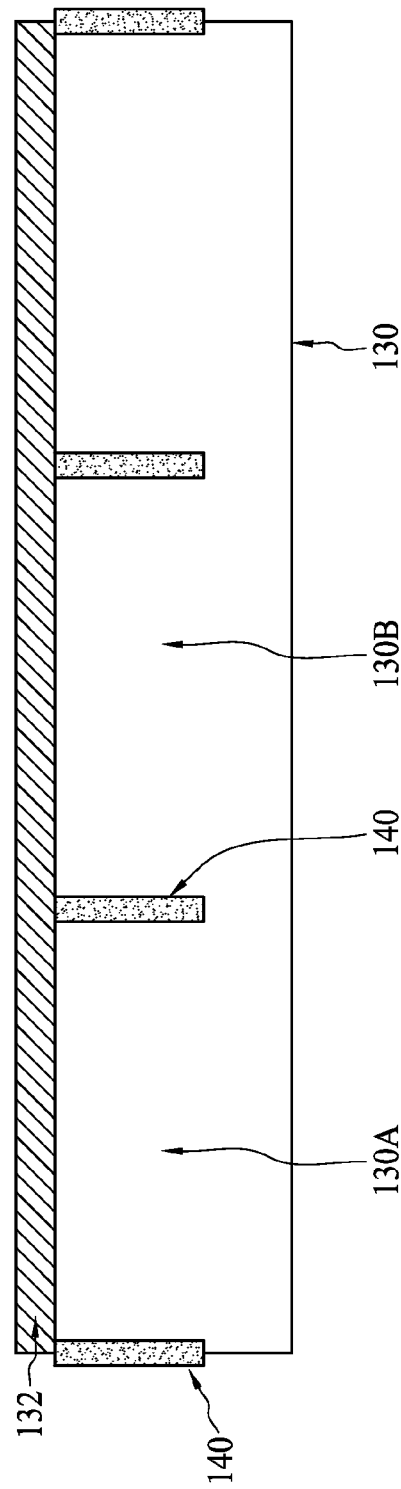
Figure 11B:
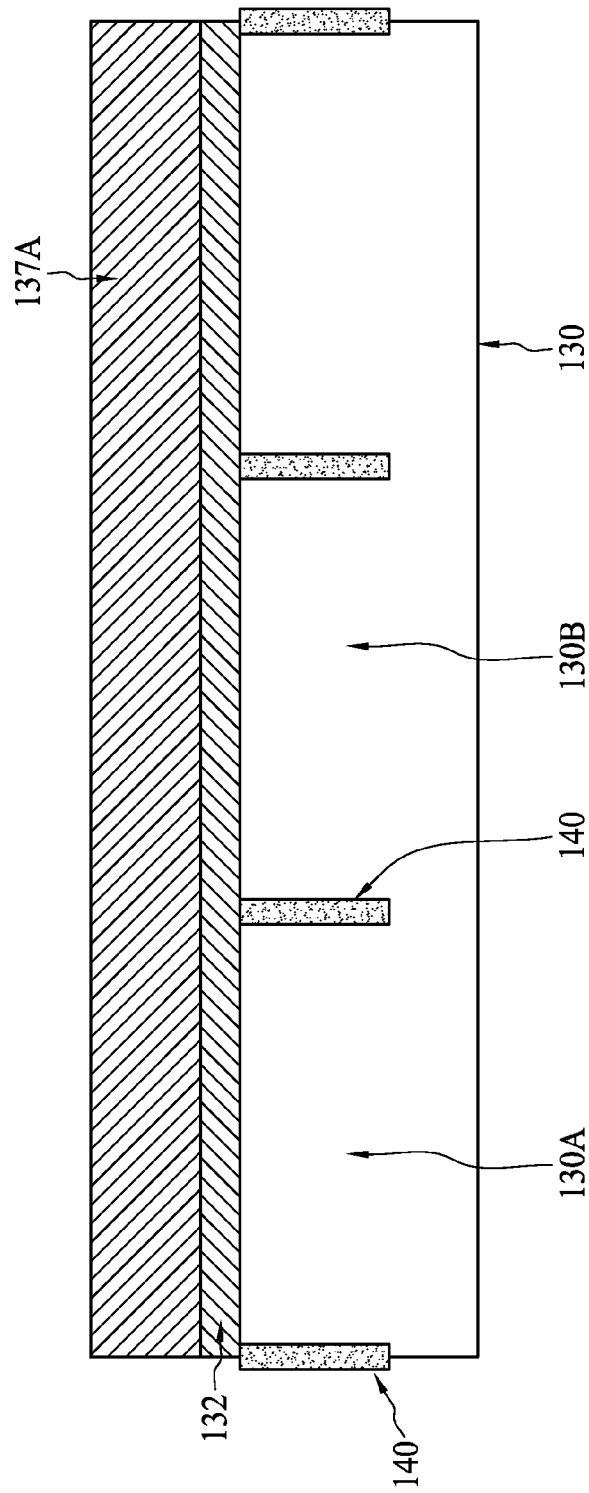
Figure 11C:
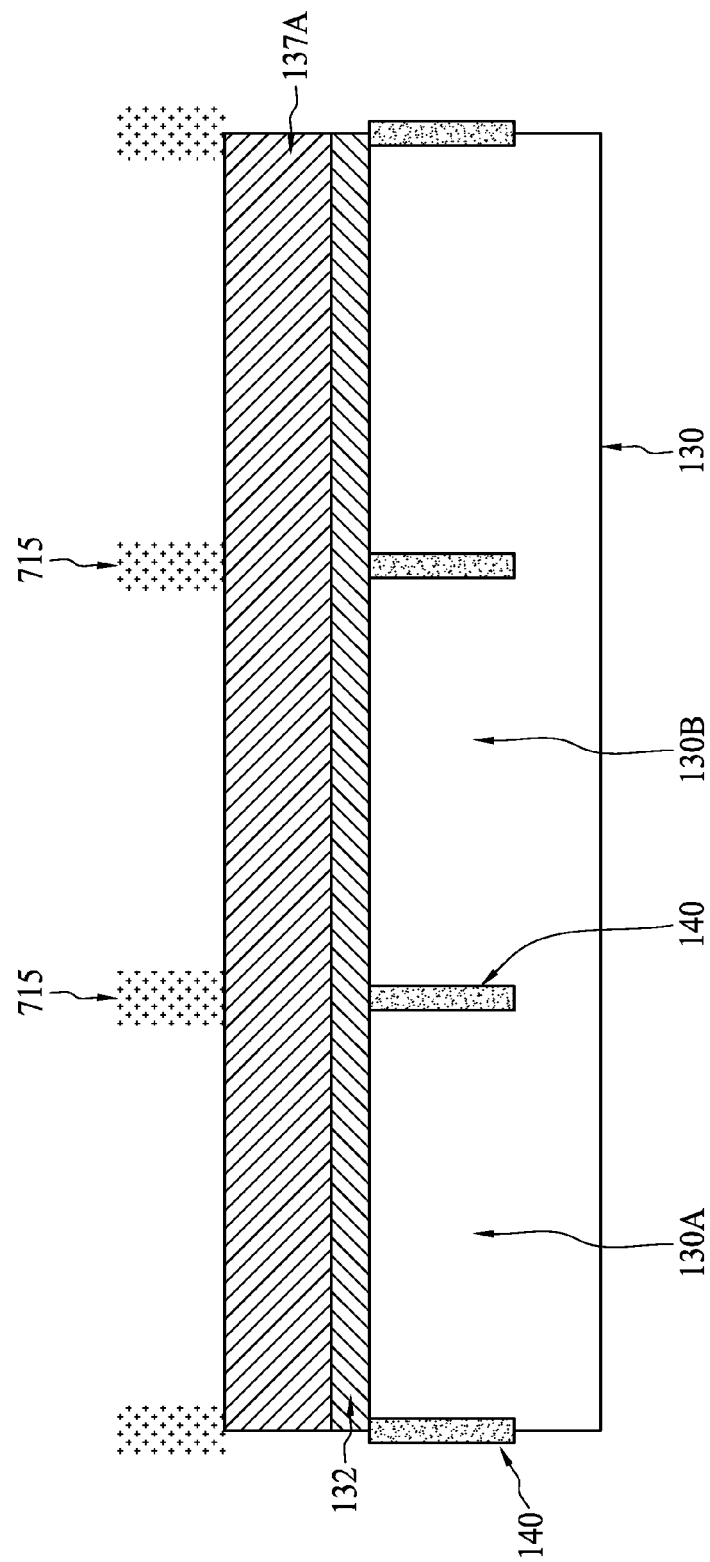
Figure 11E:
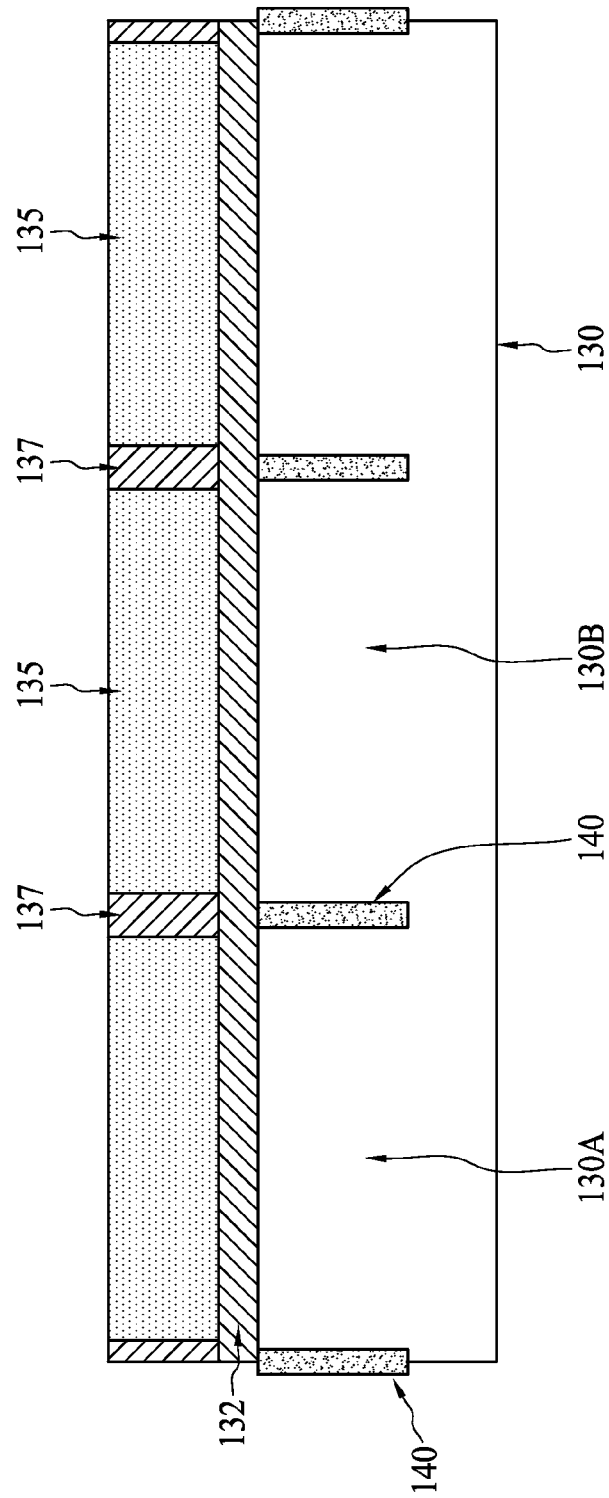
Figure 11F:
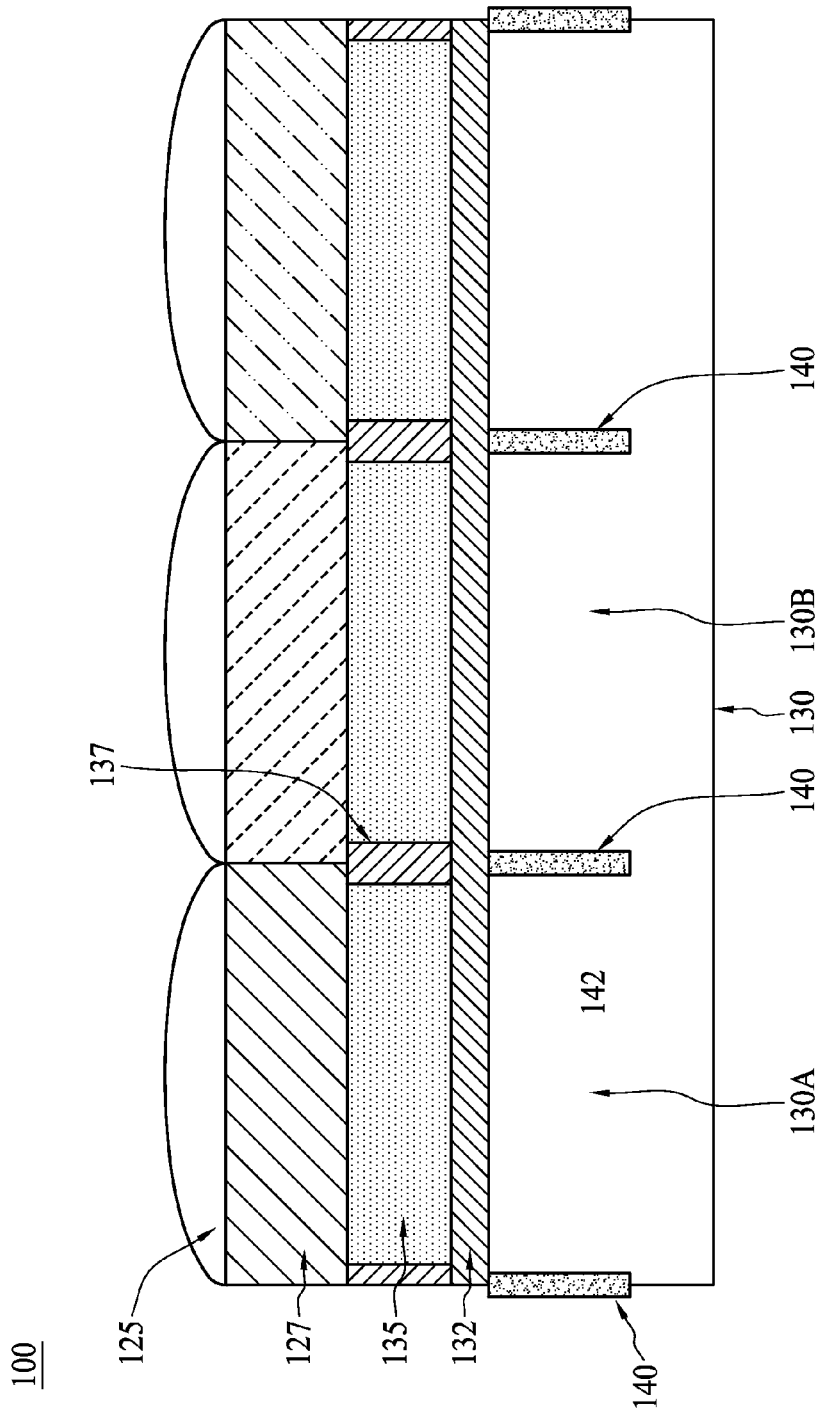

FIGS. 11A to 11F illustrate an operation to form the optical region 105 in FIG. 1, in accordance with some embodiments. In FIG. 11A, the ARC 132 is formed on the substrate 130. In FIG. 11B, a film 137A is disposed on the ARC 132. In some embodiments, the film 137A includes metal. In FIG. 11C, a mask layer 715 is disposed on the film 137A. Pattern of the mask layer 715 corresponds to the light guiding grid 137 as previously discussed with reference to FIG. 1. In FIG. 11D, a portion of the film 137A in FIG. 11C is removed and the light guiding grid 137 is formed. In FIG. 11E, the dielectric layer 135 is formed between the light guiding grid 137. In FIG. 11F, the filter 127 and the lens 125 are formed on the dielectric layer 135.

In some embodiments, an image sensor includes an image sensing substrate having an image sensing device, a first sensor pixel, a second sensor pixel, and a divider. The second sensor pixel is adjacent to the first sensor pixel. The divider is between the first sensor pixel and the second sensor pixel.

In some embodiments, the image sensing substrate has a refractive index and the divider has a refractive index. The substrate's refractive index is greater than the divider's refractive index.

In some embodiments, the divider has a width in between about one half and about two times of a light guiding grid's width.

In some embodiments, the divider has a height in between about one half and about two times of a light guiding grid's height.

In some embodiments, the image sensor includes a sensing region in an image sensing substrate and an optical region over the sensing region. The image sensor has a light guiding grid in the optical region and a divider in the sensing region.

In some embodiments, the image sensor includes an interface between the optical region and the sensing region. The divider is not in contact with the interface.

In some embodiments, a method of manufacturing an image sensor includes forming a trench in an image sensing substrate; filling dielectric in the trench; and forming an optical region on the image sensing substrate.

In some embodiments, the method of manufacturing an image sensor includes filling dielectric in the trench and over a top surface of the image sensing substrate.

In some embodiments, the method of manufacturing an image sensor includes removing the dielectric overlaid on the top surface.

The above description includes exemplary operations, but these operations are not necessarily required to be performed in the order shown. Operations may be added, replaced, changed order, skipped, and/or eliminated as appropriate, in accordance with the spirit and scope of the disclosure. Accordingly, the scope of the disclosure should be determined with reference to the following claims, along with the full scope of equivalences to which such claims are entitled.

What is claimed is:

1. An image sensor, comprising:
an image sensing substrate including:
  an image sensing device;
  a first sensor pixel and a second sensor pixel adjacent to the first sensor pixel; and
  a divider between the first sensor pixel and the second sensor pixel,
a light guiding grid above and vertically aligning with the divider;
wherein the image sensing substrate has a refractive index; the divider has a refractive index; and the substrate's refractive index is greater than the divider's refractive index.

2. The image sensor of claim 1, further comprising an anti reflection coating (ARC) between the divider and the light guiding grid.

3. The image sensor of claim 1, wherein the divider includes dielectric material.

4. The image sensor of claim 1, further comprising a boundary between the first sensor pixel and the second sensor pixel, wherein the divider is symmetrical with reference to the boundary.

5. The image sensor of claim 1, wherein a light guiding grid being above and vertically aligning with the divider, and the divider having sections separating from one another.

6. The image sensor of claim 1, wherein the divider aligns with the light guiding grid.

7. The image sensor of claim 1, wherein a width of the divider is between about one half and about two times of a width of the light guiding grid.

8. The image sensor of claim 1, wherein a height of the divider is between about one half and about two times of a height of the light guiding grid.

9. The image sensor of claim 1, wherein a top surface of the divider is below a surface of the image sensing substrate.

10. The image sensor of claim 1, further comprising an interface between the light guiding grid and the image sensing substrate, wherein the divider is not in contact with the interface.

* * * * *